US012770673B2

(12) United States Patent
Lee et al.

(10) Patent No.: US 12,770,673 B2
(45) Date of Patent: Oct. 20, 2026

12
(54) ACTIVE INTERPOSER SYSTEM

(71) Applicant: Rambus Inc., San Jose, CA (US)

(72) Inventors: Dongyun Lee, Sunnyvale, CA (US); Mark D. Kellam, Siler City, NC (US); Joohee Kim, Sunnyvale, CA (US)

(73) Assignee: Rambus Inc., San Jose, CA (US)

( * ) Notice: Subject to any disclaimer, the term of this patent is extended or adjusted under 35 U.S.C. 154(b) by 143 days.

(21) Appl. No.: 18/796,915

(22) Filed: Aug. 7, 2024

(65) Prior Publication Data

US 2025/0061935 A1 Feb. 20, 2025

Related U.S. Application Data

(60) Provisional application No. 63/533,093, filed on Aug. 16, 2023.

(51) Int. Cl.

| | |
|---|---|
| ***G11C 11/40*** | (2006.01) |
| ***G11C 11/4074*** | (2006.01) |
| ***G11C 11/4076*** | (2006.01) |
| ***G11C 11/419*** | (2006.01) |

(52) U.S. Cl.
CPC ...... *G11C 11/4076* (2013.01); *G11C 11/4074* (2013.01); *G11C 11/419* (2013.01)

(58) Field of Classification Search
CPC ............ G11C 11/4076; G11C 11/4074; G11C 11/419
See application file for complete search history.

(56) References Cited

U.S. PATENT DOCUMENTS

| | | | | |
|---|---|---|---|---|
| 6,600,364 | B1 | 7/2003 | Liang et al. | |
| 10,651,156 | B2 | 5/2020 | Yu et al. | |
| 11,329,734 | B2 | 5/2022 | Nasrullah et al. | |
| 11,367,707 | B2 | 6/2022 | Liff et al. | |
| 2009/0031155 | A1* | 1/2009 | Hofmann .............. | G06F 1/3296 713/320 |
| 2010/0115324 | A1* | 5/2010 | Kuroki ................. | G11C 7/1051 365/194 |
| 2020/0098725 | A1 | 3/2020 | Liff et al. | |
| 2022/0028848 | A1 | 1/2022 | Baek | |
| 2022/0320042 | A1 | 10/2022 | Mantor | |

* cited by examiner

*Primary Examiner* — Xiaochun L Chen
(74) *Attorney, Agent, or Firm* — The Neudeck Law Firm, LLC

(57) ABSTRACT

An interposer interconnecting a first integrated circuit and a second integrated circuit includes active circuitry. The “active” interposer converts high-speed signals into lower-speed, but more parallelized, signals for transmission across the active interposer. The parallelized signals may be buffered or amplified at intervals while crossing the active interposer. The high-speed to low-speed, and back, conversions may be performed by an appropriately configured and controlled multiplexer/demultiplexer circuitry The supply voltages for some interposer circuits may be different than the supply voltages for the interfaces with the first and second integrated circuit. One or more of the interconnected integrated circuits may supply, and/or calibrate the supply voltages for the interposer circuitry. Timing signals provided by one or more of the interconnected integrated circuits may also be calibrated using circuitry on the active interposer.

20 Claims, 11 Drawing Sheets

ACTIVE INTERPOSER SYSTEM

DETAILED DESCRIPTION OF THE EMBODIMENTS

In an embodiment, an interposer (or alternatively, a silicon bridge) interconnecting a first integrated circuit (e.g., CPU, controller, System on a Chip—SoC, etc.) and a second integrated circuit (e.g., DRAM, high-bandwidth memory stack—HBM, etc.) includes active circuitry. The "active" interposer converts high-speed signals into lower-speed, but more parallelized, signals for transmission across the active interposer. The parallelized signals may be buffered or amplified (a.k.a., re-driven) at intervals while crossing the active interposer.

In an embodiment, the high-speed to low-speed, and back, conversions may be performed by an appropriately configured and controlled multiplexer/demultiplexer (MUX/DEMUX) circuitry (a.k.a., serializer/deserializer-SERDES circuitry). The supply voltages for the SERDES circuitry and re-drivers may be different than the supply voltages for the interfaces with the first and second integrated circuit. One or more of the interconnected integrated circuits may supply, and/or calibrate the supply voltages for the SERDES and re-drive circuitry. Timing signals provided by one or more of the interconnected integrated circuits may also be calibrated using circuitry on the active interposer.

Figure 1:
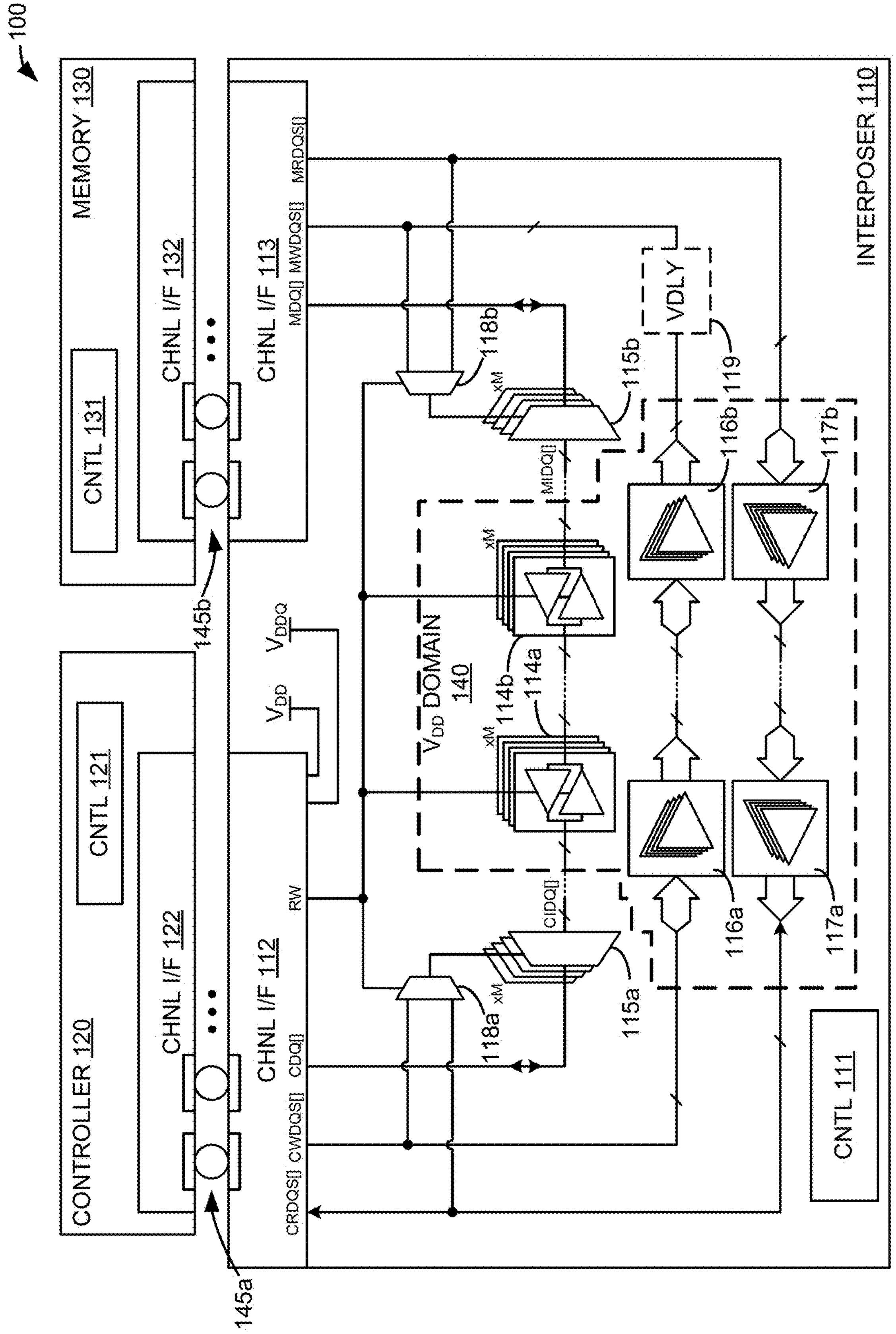
FIG. 1 is a block diagram illustrating an example system with an active interposer.

FIG. 1 is a block diagram illustrating a system with an active interposer. In FIG. 1, system 100 comprises interposer 110, controller 120, and memory device 130. Interposer 110 includes control circuitry 111, channel interface 112, channel interface 113, buffer circuitry 114*a*-114*b*, MUX/DEMUX circuitry 115*a*-115*b*, strobe buffers 116*a*-116*b*, strobe buffers 117*a*-117*b*, strobe selectors (MUXs) 118*a*-118*b*, and optional variable delay circuitry 119. Controller 120 includes control circuitry 121 and channel interface 122. Memory device 130 include control circuitry 131 and channel interface 132. Channel interface 122 of controller 120 is connected to channel interface 112 of interposer 110 via connections 145*a* (e.g., solder ball, bumps, etc.). Channel interface 132 of memory device 130 is connected to channel interface 113 of interposer 110 via connections 145*b* (e.g., solder ball, bumps, etc.).

Controller 120 and memory device 130 may comprise integrated circuit type devices, such as those commonly referred to as "chips". In an embodiment, memory device 130 may be, or comprise, a stacked die component comprising a stack of dynamic random access memory (DRAM) integrated circuit die co-packaged together and coupled to each other via wired bonds and/or through-silicon vias (TSVs). Examples of a stacked die component comprising DRAM integrated circuit dies include High Bandwidth Memory (HBM) type components.

A memory controller, such as controller 120, manages the flow of data going to and from memory devices. Functionality of a memory controller may be included on a single die with a microprocessor, or included as part of a more complex integrated circuit system as a block of a system on a chip (SOC). For example, a memory controller may be a northbridge chip, an application specific integrated circuit (ASIC) device, a load-reduction memory buffer, a graphics processor unit (GPU), a system-on-chip (SoC) or an integrated circuit device that includes many circuit blocks such as ones selected from graphics cores, processor cores, and MPEG encoder/decoders, etc.

In an embodiment, interposer 110 interconnects controller 120 and memory device 130. In particular, interposer 110 functions to communicate high-speed signals (e.g., data-DQ, and command/address-CA, signals) transmitted or received via channel interface 122 of controller 120 (and thus also via channel interface 112 of interposer 110) and channel interface 132 of memory device 130 (and thus also via channel interface 113 of interposer 110) between channel interface 122 of controller 120 and channel interface 132 of memory device 130. Interposer 110 converts high-speed signals received via channel interface 112 and channel interface 113 (i.e., received from controller 120 and memory device 130, respectively) into multiple lower-speed parallel signals. These lower-speed parallel signals may be re-driven by a series of buffers (e.g., buffer circuitry 114*a*-114*b*) while being propagated across interposer 110. After being propagated to near their respective destination interface 112-113, the lower-speed parallel signals are converted back to higher-speed signals for transmission via their respective destination interface 112-113 to controller 120 and memory device 130, respectively.

Conversion of the signals between high-speed to lower-speed may be performed by MUX/DEMUX functions (e.g., MUX/DEMUX circuitry 115*a*-115*b*) that are synchronized by strobe signals (e.g., read data strobes—RDQS, write data strobes—WDQS) provided by controller 120 and/or memory device 130. These strobe signals are also propagated (and optionally buffered—e.g., by strobe buffers 116*a*-116*b* 177*a*-117*b*) across interposers 110 to synchronize the communication of data with controller 120 and memory device 130.

In an embodiment, the MUX/DEMUX function (e.g., MUX/DEMUX circuitry 115*a*-115*b*) and the re-drive buffers (e.g., buffer circuitry 114*a*-114*b*) operate using different power supply voltages (e.g., $V_{DDQ}$ and $V_{DD}$). These different power supply voltages may be calibrated separately (or independently) of each other in order to meet power consumption and/or delay targets or optimizations. In particular, as the $V_{DD}$ voltage level is increased, the delay through buffer circuitry 114*a*-114*b*, strobe buffers 116*a*-116*b*, and/or strobe buffers 117*a*-117*b* is decreased while the power consumed by buffer circuitry 114*a*-114*b*, strobe buffers 116*a*-116*b*, and/or strobe buffers 117*a*-117*b* is increased. Thus, controller 120 may set the voltage level of $V_{DD}$ to tradeoff power consumption by interposer 110 versus delay through interposer 110 in order to meet desired delay and power consumption goals for a given application/use case.

Strobe signals may also be calibrated by controller 120, memory device 130, and/or interposer 110. In an embodiment, one or more strobe signals may be calibrated by interposer 110 in response to commands or signals from controller 120 (e.g., under the control of control circuitry 121).

In FIG. 1, bidirectional high-speed data signals (e.g., M number of high-speed signals) to/from controller 120 (shown as controller-side DQ signals—CDQ[ ]) are operatively coupled between channel interface 112 and MUX/DEMUX circuitry 115*a*. MUX/DEMUX circuitry 115*a* converts these high-speed data signals (CDQ[ ]) to/from lower-speed parallel signals (shown as controller-side intermediate DQ signals—CIDQ[ ]). For example, MUX/DEMUX circuitry 115*a* may convert each high-speed data signal (CDQ[ ]) to/from a N number of lower-speed parallel signals (i.e., a serialization/deserialization factor of N)—thus reducing the bandwidth required to communicate each individual lower-speed parallel signal by a factor of N when compared to the higher-speed signal communicated with controller 120. Because of the parallelization of the lower-speed signals, N times as many lower speed signals are used to communicate each high-speed signal (e.g., if there are M number of high-speed signals, then M×N lower-speed signals will be used by interposer 110 to propagate M high-speed signals between interfaces 112-113).

While the lower-speed signals are propagated from/to MUX/DEMUX circuitry 115*a* (shown as CIDQ[ ] at MUX/DEMUX circuitry 115*a*) to/from MUX/DEMUX circuitry 115*b* (shown as memory-side intermediate DQ signals—MIDQ[ ] at MUX/DEMUX circuitry 115*b*), buffer circuitry 114*a*-114*b* may re-drive the propagating lower-speed signals. Buffer circuitry 114*a*-114*b* may re-drive the propagating lower-speed signals in order to improve signal integrity, decrease delay and/or reduce overall power consumption (when compared to not re-driving the lower-speed signals).

The lower-speed signals (MIDQ[ ]) are also coupled with MUX/DEMUX circuitry 115*b*. MUX/DEMUX circuitry 115*b* converts lower-speed parallel signals (MIDQ[ ]) to/from high-speed data signals (memory-side DQ signals—MDQ[ ]) that are operatively coupled to channel interface 113 (and thus coupled with memory device 130). For example, MUX/DEMUX circuitry 115*b* may convert each higher-speed data signal from/to N number of lower-speed parallel signals (i.e., a serialization/deserialization factor of N) that are communicated with memory device 130 via interface 113.

In FIG. 1, buffer circuitry 114*a*-114*b* and strobe buffers 116*a*-116*b* 117*a*-117*b* are operated using $V_{DD}$ as a power supply voltage, while MUX/DEMUX circuitry 115*a*-115*b* and other circuitry (e.g., interface 112, interface 113, etc.) are operated using $V_{DDQ}$ as a power supply voltage. This is illustrated in FIG. 1 by the dashed box labeled $V_{DD}$ domain 140 around buffer circuitry 114*a*-114*b* and strobe buffers 116*a*-116*b* 117*a*-117*b*. In an embodiment, controller 120 provides $V_{DD}$ and $V_{DDQ}$ to interposers 110. By providing $V_{DD}$ to interposer 110, controller 120 may adjust and/or calibrate the voltage of $V_{DD}$. Controller 120 may adjust and/or calibrate the voltage of VDD in order to reach thresholds, targets, and/or optimizations for delay (e.g., between MUX/DEMUX circuitry 115*a* and MUX/DEMUX circuitry 115*b*) and/or thresholds, targets, and/or optimizations for power consumption.

First strobe signals (shown as controller-side write data strobe signals—CWDQS[ ] at interface 112) are transmitted by controller 120 via interface 122 and interface 112 to synchronize the high-speed signals transmitted by controller 120 via interposer 110 to memory device 130. Controller 120 adjusts the timing of the first (one or more) strobe signals in order to ensure correct serialization (e.g., by MUX/DEMUX circuitry 115*a*), correct deserialization (e.g., by MUX/DEMUX circuitry 115*b*), and correct communication with memory device 130 (e.g., via interface 113 and interface 132). Variable delay 119 (if present), is coupled between strobe buffer 116*b* and channel interface 113 to change the timing of the MWDQS[ ] strobe signals received by memory device 130. Controller 120 may adjust variable delay 119 to compensate for a strobe signal tree inside memory device 130.

The first strobe signals are propagated from interface 112 to interface 113 by interposer 110. While the first strobe signals are being propagated, strobe buffers 116*a*-116*b* may re-drive the propagating first strobe signals (shown as memory-side write data strobe signals—MWDQS[ ] at interface 113). Strobe buffers 116*a*-116*b* may re-drive the propagating lower-speed signals in order to improve signal integrity, match, or compensate for, the data signal (e.g., CDQ[ ], MDQ[ ]) propagation delays across interposer 110, decrease delay and/or reduce overall power consumption (when compared to not buffering the first strobe signals).

Second strobe signals (shown as memory-side read data strobe signals—MRDQS[ ]) are transmitted by memory device 130 via interface 132 and interface 113 to synchronize the high-speed signals transmitted by memory device 130 via interposer 110 to controller 120. Memory device 130 (e.g., under the control of, or in response to a command from controller 120) may adjust the timing of the second (one or more) strobe signals in order to ensure correct deserialization (e.g., by MUX/DEMUX circuitry 115*b*), correct serialization (e.g., by MUX/DEMUX circuitry 115*a*), and correct communication with controller 120 (e.g., via interface 112 and interface 122). The second strobe signals are propagated from interface 113 to interface 112 by interposer 110. While the second strobe signals are being propagated, strobe buffers 117*a*-117*b* may re-drive the propagating second strobe signals (shown as controller-side read data strobe signals—CRDQS[ ] at interface 112). Strobe buffers 117*a*-117*b* may re-drive the propagating lower-speed signals in order to improve signal integrity, match, or compensate for, the data signal (e.g., CDQ[ ], MDQ[ ]) propagation delays across interposer 110, decrease delay and/or reduce overall power consumption (when compared to not buffering the second strobe signals).

In an embodiment, the direction (i.e., from MUX/DEMUX circuitry 115*a* to MUX/DEMUX circuitry 115*b*, or from MUX/DEMUX circuitry 115*b* to MUX/DEMUX circuitry 115*a*) that buffer circuitry 114*a*-114*b* is controlled to propagate the lower-speed signals is controlled by a read/write (RW) signal from controller 120. In another embodiment (not shown in FIG. 1), the direction that buffer circuitry 114*a*-114*b* is controlled to propagate the lower-speed signals is controlled by a signal derived from the first strobe signals and/or the second strobe signals.

The read/write signal (or derived read/write signal) also controls which of the first strobe signals and the second strobe signals are to synchronize the serialization/deserialization functions performed by MUX/DEMUX circuitry 115*a* and MUX/DEMUX circuitry 115*b*). In particular, when the read/write signal is indicating a write from controller 120 to memory device 130, strobe selector 118*a* selects the first strobe signals (i.e., controller-side WDQS—CWDQS[ ]) to synchronize the deserialization performed by MUX/DEMUX circuitry 115*a*. Also when the read/write signal is indicating a write from controller 120 to memory device 130, strobe selector 118*b* selects the propagated first strobe signals (i.e., memory-side WDQS—MWDQS[ ]) to synchronize the reconstruction (a.k.a., re-serialization or serialization) of the high-speed signals performed by MUX/DEMUX circuitry 115*b*.

When the read/write signal is indicating a read from memory device 130 by controller 120, strobe selector 118*b* selects the second strobe signals (e.g., memory-side RDQS—MRDQS[ ]) transmitted by memory device 130 to synchronize the deserialization performed by MUX/DEMUX circuitry 115*b*. Also when the read/write signal is indicating a read from memory device 130 by controller 120, strobe selector 118*a* selects the propagated second strobe signals (e.g., controller-side RDQS—CRDQS[ ]) to synchronize the reconstruction (a.k.a., re-serialization or serialization) of the high-speed signals performed by MUX/DEMUX circuitry 115*a*.

It should also be understood that command/address (CA) signals may be propagated (and buffered, etc.) between controller 120 and memory device 130 by interposer 110. However, for the sake of clarity and brevity, the CA signals associated with interface 112 and interface 113 have been omitted from FIG. 1. It should also be understood that unidirectional CA signals (if any) propagated by interposer 110 would not need the bidirectional capabilities of MUX/DEMUX circuitry 115*a*-115*b* and buffer circuitry 114*a*-114*b* and may, in some embodiments, be disabled or eliminated.

Figure 2A:
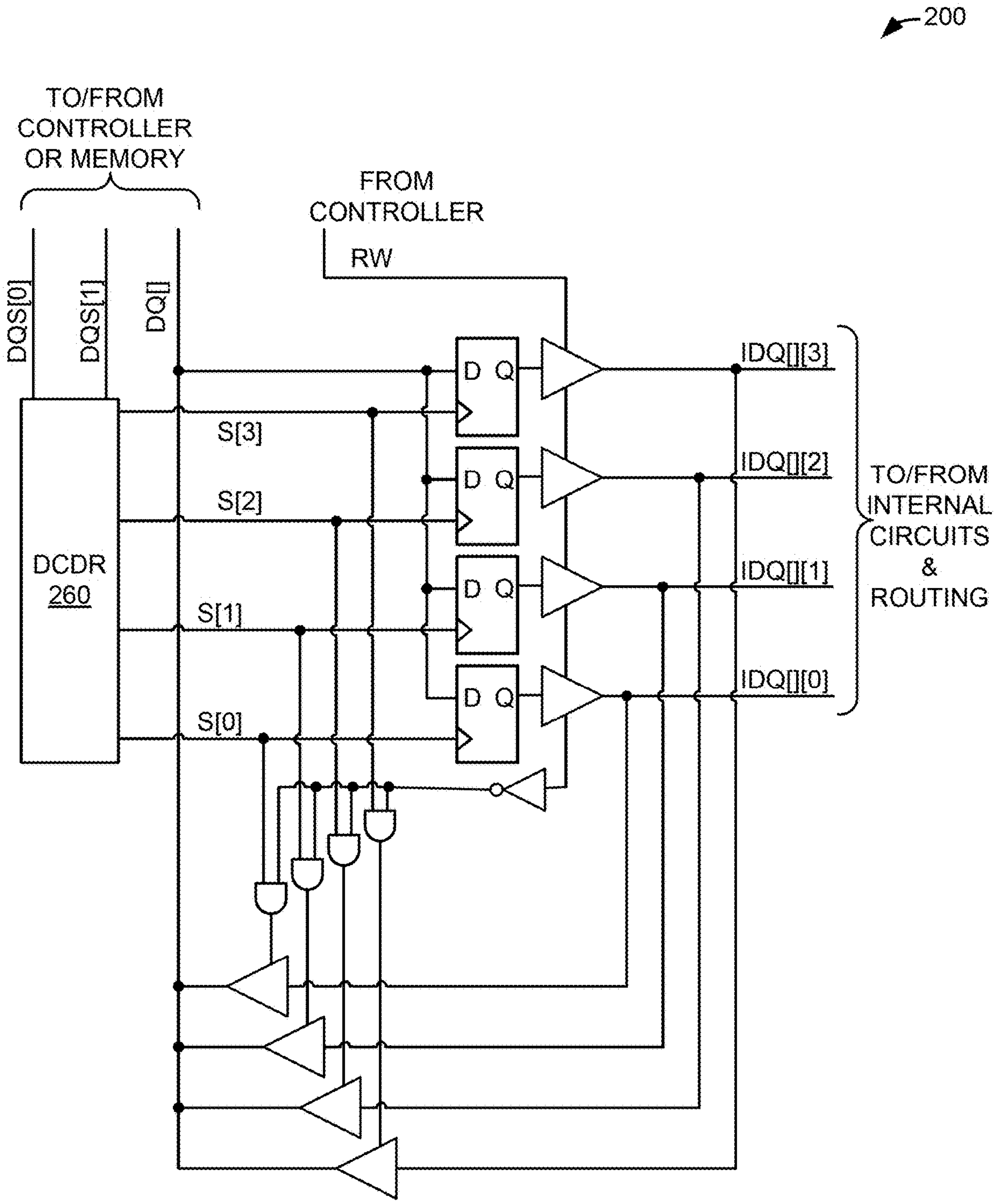
FIGS. 2A-2C are diagrams illustrating an example multiplexer/demultiplexer (MUX/DEMUX).
Figure 2B:
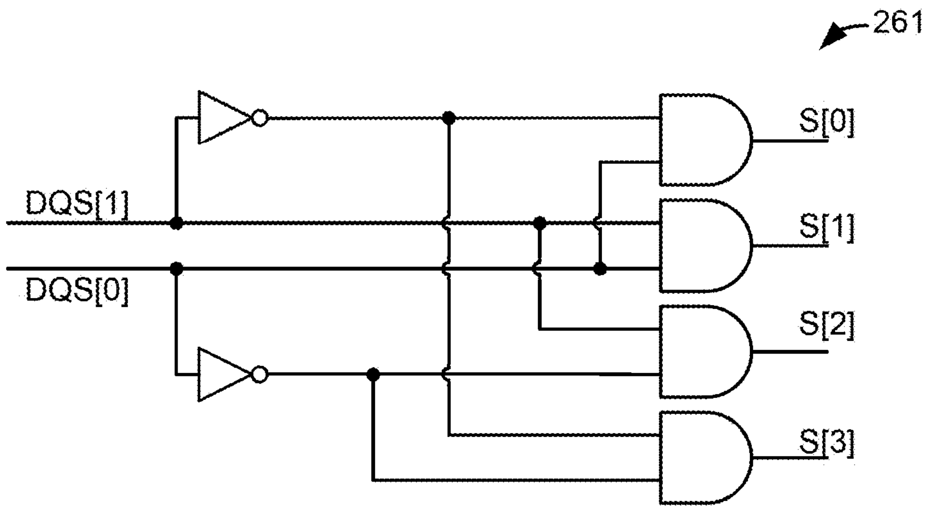
Figure 2C:
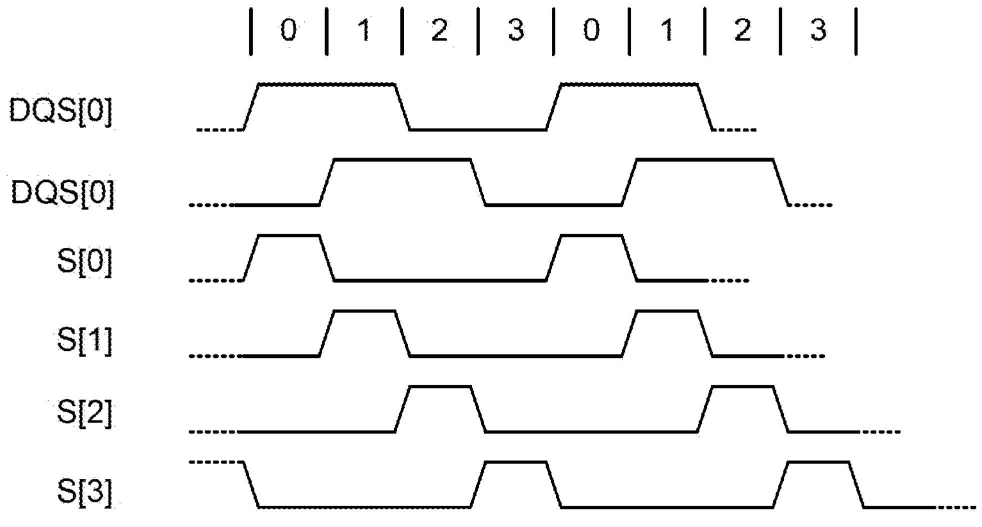

FIGS. 2A-2C are diagrams illustrating an example multiplexer/demultiplexer (MUX/DEMUX). FIG. 2A illustrates MUX/DEMUX circuitry 200. The functioning of MUX/DEMUX circuitry 200 is suitable for use as an example of MUX/DEMUX circuitry 115*a*-115*b*. MUX/DEMUX circuitry 200 is to be coupled (e.g., via data strobe selectors 118*a*-118*b*) to receive data strobe signals (e.g., CWDQS[ ], CRDQS[ ], MWDQS[ ], and/or MRDQS[ ]) and a read/write signal (RW). The received data strobe signals (DQS [1:0]) are provided to decoder 260. MUX/DEMUX circuitry 200 is also to be coupled to high-speed data signals (e.g., CDQ[ ] and/or MDQ[ ]). MUX/DEMUX circuitry 200 is also to be coupled to lower-speed signals (e.g., CIDQ[ ] and/or MIDQ[ ]).

Decoder 260 receives data strobe signals and produces a plurality (e.g., 4) "one-hot" signals from the data strobe signals. In other words, decoder 260 decodes overlapping data strobe signals that have a plurality unique states (e.g., 00, 01, etc.) into a corresponding plurality of signals that are each only active during a corresponding one of the unique states. FIG. 2B illustrates an example circuit for decoding two overlapping (e.g., quadrature) data strobes into "one-hot" signals suitable for use as decoder 260. FIG. 2C illustrates a timing diagram showing the decoding of two overlapping (e.g., quadrature) data strobes into "one-hot" signals suitable for use as MUX/DEMUX circuitry 200.

Figure 3A:
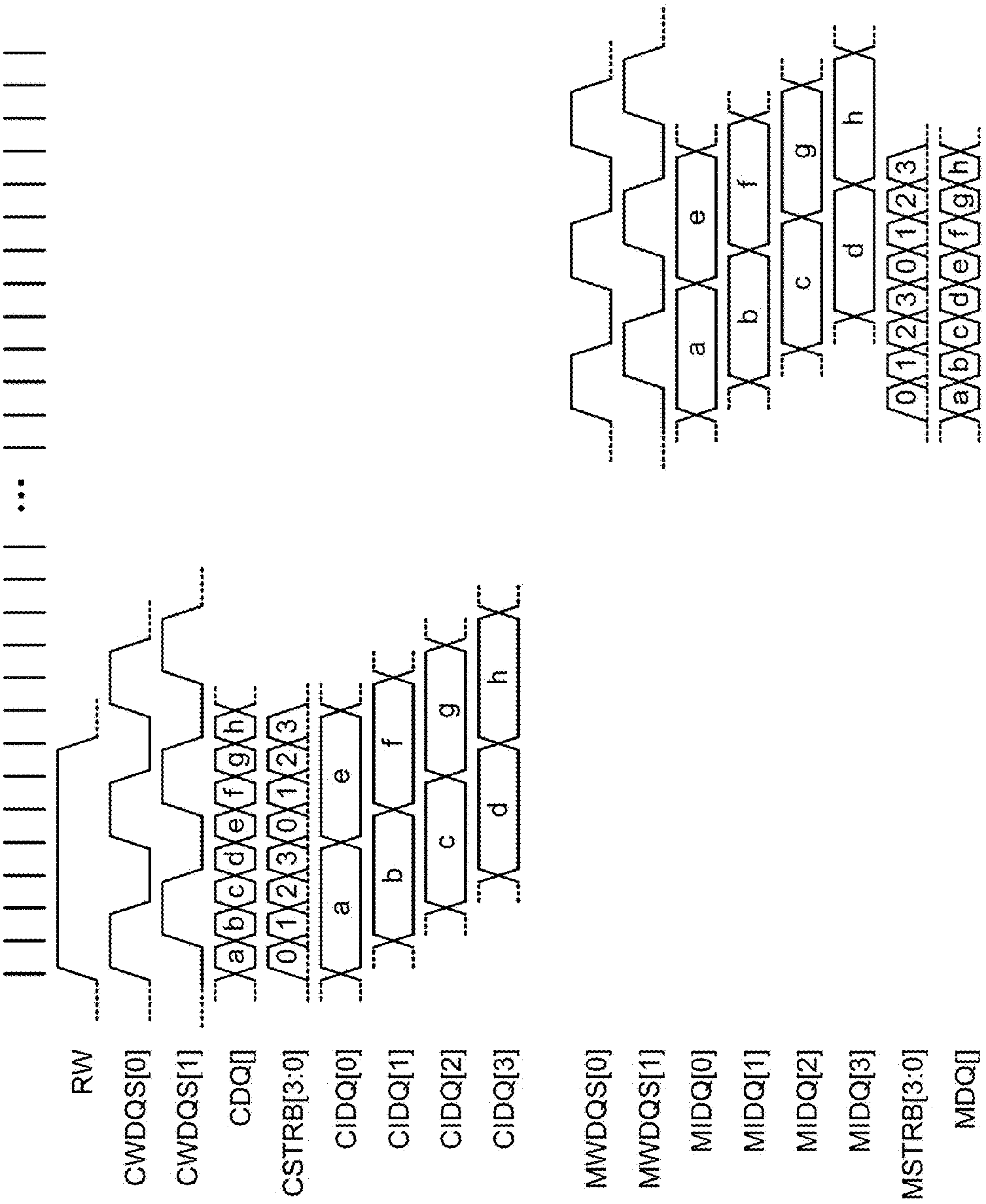
FIGS. 3A-3B are example timing diagrams illustrating the operation of an example active interposer.
Figure 3B:
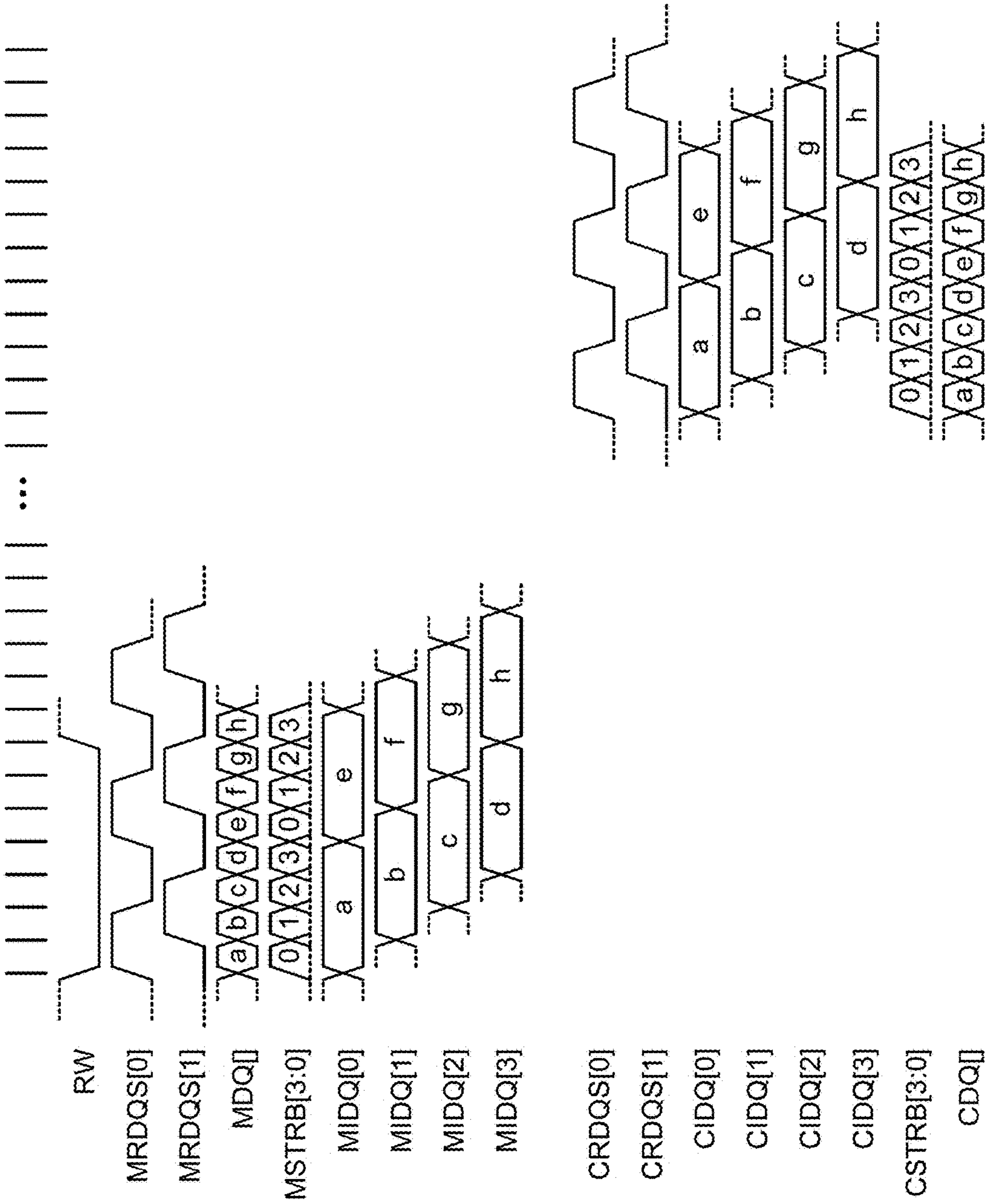

FIG. 3A is an example timing diagrams illustrating signals on an example interposer (e.g., interposer 110) during a write operation (i.e., data flowing from controller 120 to memory device 130). FIG. 3B is an example timing diagrams illustrating signals on an example interposer (e.g., interposer 110) during a read operation (i.e., data flowing from memory device 130 to controller 120). In an embodiment, CA signals propagated by interposer 110 may operate similarly to the DQ signals illustrated in FIG. 3A, however, without a dependency on the RW signal.

Figure 4:
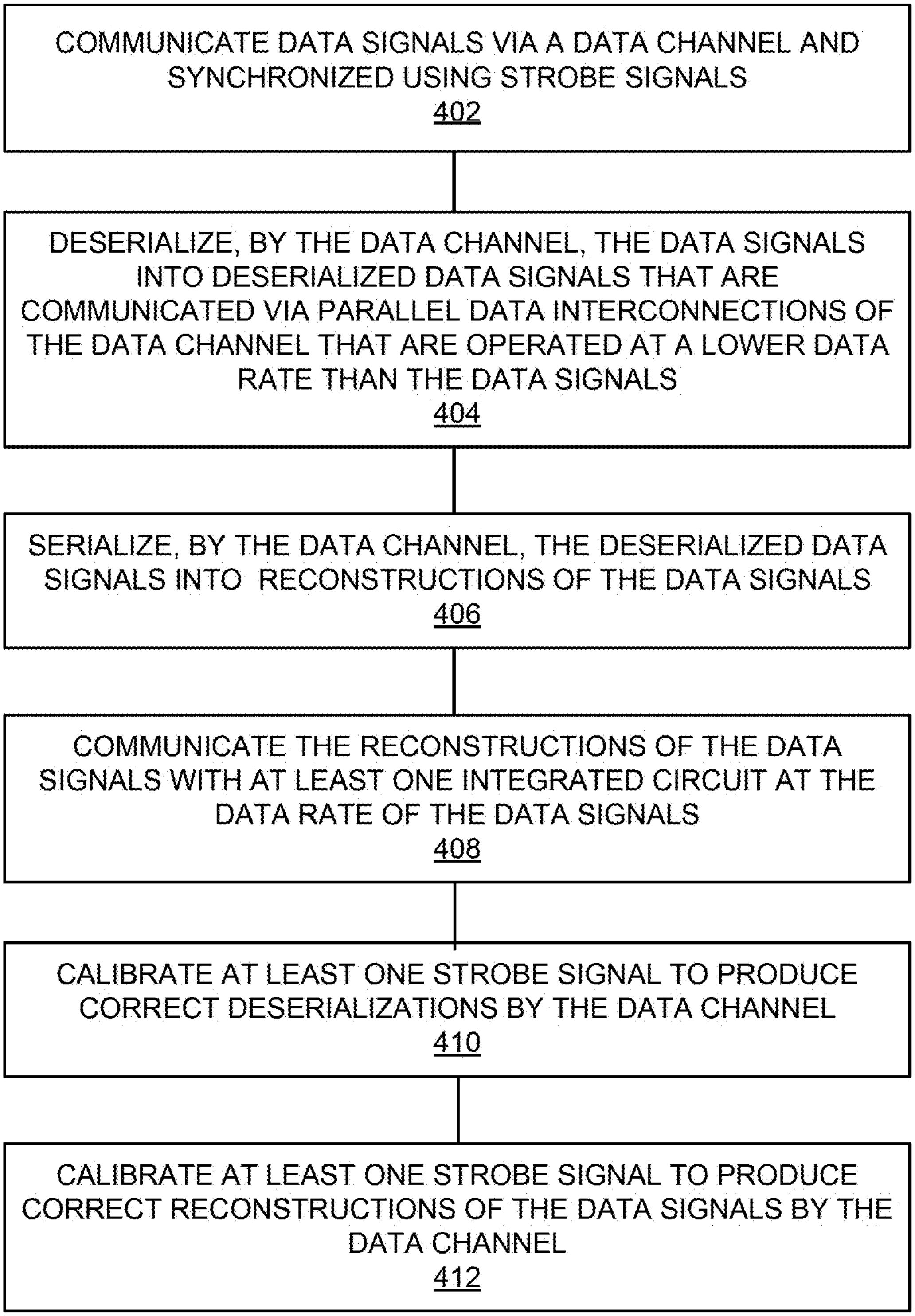
FIG. 4 is a flowchart illustrating a method of operating a communication system.

FIG. 4 is a flowchart illustrating a method of operating a communication system. One or more steps illustrated in FIG. 4 may be performed by, for example, system 100, MUX/DEMUX circuitry 200, and/or their components. Data signals are communicated via a data channel and synchronized using strobe signals (402). For example, controller 120 may communicate high-speed bidirectional data signals (e.g., CDQ[ ]) with interposer 110 synchronized by strobe signals WDQS[ ]. In another example, memory device 130 may communicate high-speed bidirectional data signals (e.g., MDQ[ ]) with interposer 110 synchronized by strobe signals RDQS[ ].

By the data channel, the data signals are deserialized into deserialized data signals that are communicated via parallel data interconnections of the data channel that are operated at a lower data rate than the data signals (404). For example, MUX/DEMUX circuitry 115*a* may deserialize high-speed data signals CDQ[ ] from interface 112 into a plurality of lower-speed data signals CIDQ[ ] that are operated (e.g., propagated to MUX/DEMUX circuitry 115*b*) at a lower data rate (e.g., a data rate that is 1/N times slower than CDQ[ ], where N is the deserialization factor—e.g., 4, 8, etc.). In another example, MUX/DEMUX circuitry 115*b* may deserialize high-speed data signals MDQ[ ] from interface 113 into a plurality of lower-speed data signals MIDQ[ ] that are operated (e.g., propagated to MUX/DEMUX circuitry 115*a*) at a lower data rate (e.g., a data rate that is 1/N times slower than MDQ[ ], where N is the deserialization factor—e.g., 4, 8, etc.).

By the data channel, the deserialized data signals are serialized into reconstructions of the data signals (406). For example, after lower-speed CIDQ[ ] signal are propagated to MUX/DEMUX circuitry 115*b* (becoming MIDQ[ ] signals), MUX/DEMUX circuitry 115*b* may serialize the MIDQ[ ] signals to reconstruct the original high-speed CDQ[ ] signals as MDQ[ ] signals. In another example, after lower-speed MIDQ[ ] signal are propagated to MUX/DEMUX circuitry 115*a* (becoming CIDQ[ ] signals), MUX/DEMUX circuitry 115*a* may serialize the CIDQ[ ] signals to reconstruct the original high-speed MDQ[ ] signals as CDQ[ ] signals.

The reconstructions of the data signals are communicated with at least one integrated circuit at the data rate of the data signals (408). For example, the reconstructed high-speed data signals (MDQ) may be communicated with memory device 130 via interface 113 and interface 132. In another example, the reconstructed high-speed data signals (CDQ) may be communicated with controller 120 via interface 112 and interface 122.

At least one strobe signal is calibrated to produce correct deserializations by the data channel (410). For example, during a calibration period, controller 120 may transmit a calibration pattern via MDQ[ ] (e.g., a toggling pattern). Memory device 130 may report back to controller 120 one or more error status indicators. Alternatively, memory device 130 may transmit the calibration pattern as received by memory device 130 back to controller 120, where controller 120 may then determine whether there were errors. Based on the error and/or loop-back information received by controller 120 from memory device 130, controller 120 may adjust the timing of one or more strobe signals transmitted by controller 120 (e.g., CWDQS[ ]), and/or cause (or command) interposer 110 to adjust the timing of one or more strobe signals and/or control circuitry 111 to adjust the timing of CWDQS[ ] that is provided to MUX/DEMUX circuitry 115*a*). In another example, based on the error and/or loop-back information received by controller 120 from memory device 130, controller 120 may instruct memory device 130 to adjust the timing of one or more strobe signals transmitted by memory device 130 (e.g., MRDQS[ ]), and/or cause (or command) interposer 110 to adjust the timing of one or more strobe signals that are provided to MUX/DEMUX circuitry 115*b*.

At least one strobe signal is calibrated to produce correct reconstructions of the data signals by the data channel (412). For example, during a calibration period, controller 120 may transmit a calibration pattern via MDQ[ ] (e.g., a toggling pattern). Memory device 130 may report back to controller 120 one or more error status indicators. Alternatively, memory device 130 may transmit the calibration pattern as received by memory device 130 back to controller 120, where controller 120 may then determine whether there were errors. Based on the error and/or loop-back information received by controller 120 from memory device 130, controller 120 may adjust the timing of one or more strobe signals (e.g., CWDQS[ ]), and/or cause (or command) interposer 110 to adjust the timing of one or more strobe signals (e.g., using control circuitry 111 to adjust the timing of MWDQS[ ] that is provided to MUX/DEMUX circuitry 115*b*). In another example, based on the error and/or loop-back information received by controller 120 from memory device 130, controller 120 may instruct memory device 130 to adjust the timing of one or more strobe signals transmitted by memory device 130 (e.g., CRDQS[ ]), and/or cause (or command) interposer 110 to adjust the timing of one or more strobe signals that are provided to MUX/DEMUX circuitry 115*a*). In another example, based on the error and/or loop-back information received by controller 120 from memory device 130, controller 120 may instruct and/or cause interposer 110 to adjust, independent of MUX/DEMUX 115*a*-115*b* and buffer circuitry 114*a*-114*b* timing, the timing of one or more strobe signals (e.g., MWDQS[ ]) that are provided to memory device 130 in order to compensate for variations inside of memory device 130 (e.g., data strobe fanout delays that alter the timing relationship between MWDQS[ ] and MDQ[ ]).

Figure 5:
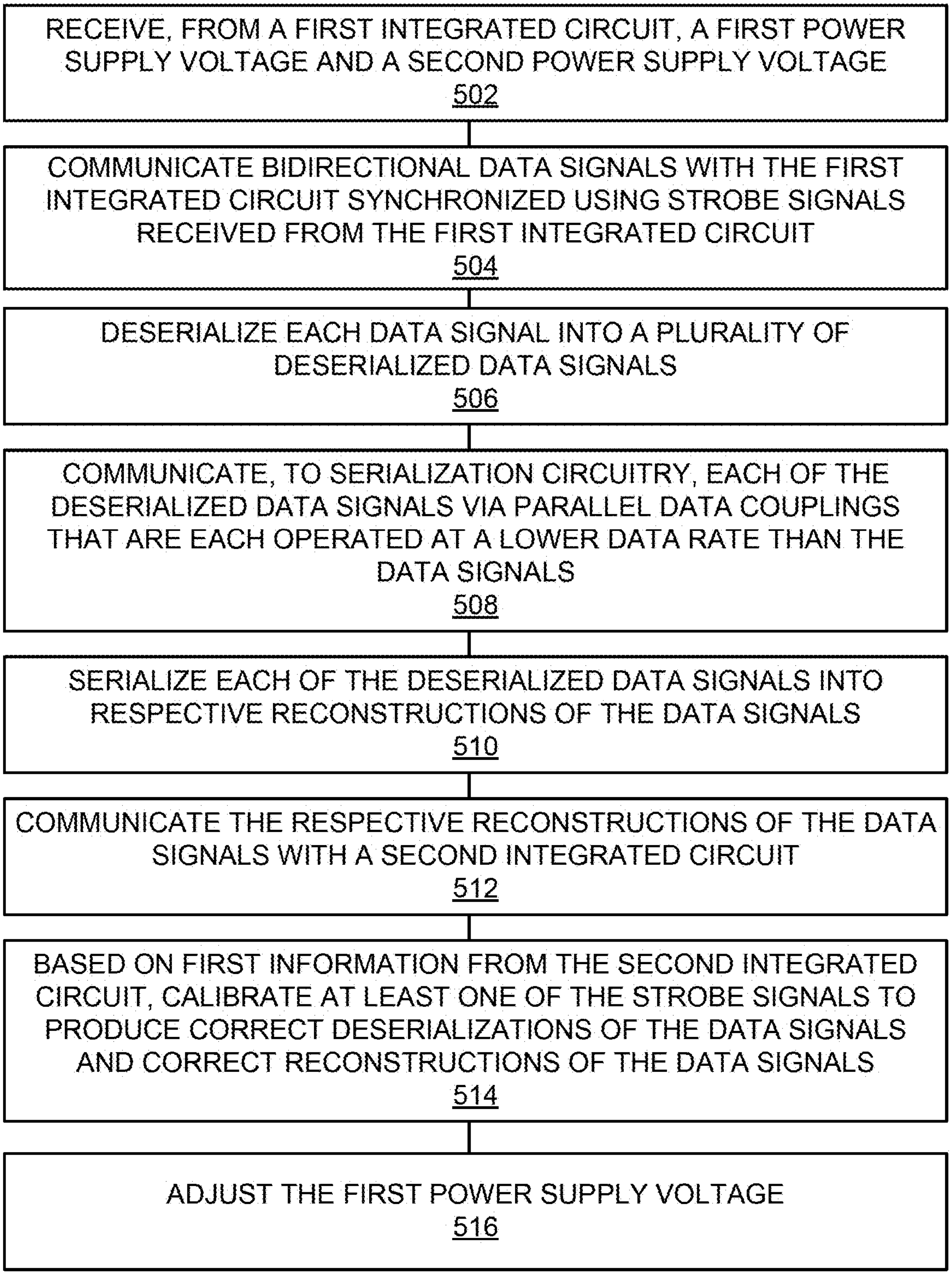
FIG. 5 is a flowchart illustrating a method of operating an active interposer.

FIG. 5 is a flowchart illustrating a method of operating an active interposer. One or more steps illustrated in FIG. 5 may be performed by, for example, system 100, MUX/DEMUX circuitry 200, and/or their components. From a first integrated circuit, a first power supply voltage and a second power supply voltage are received (502). For example, interposer 110 may receive, from controller 120, a first power supply voltage (e.g., $V_{DD}$) to power the circuits in $V_{DD}$ domain 140, and a second power supply voltage (e.g., $V_{DDQ}$) to power the rest of the circuitry of interposer 110.

Bidirectional data signals are communicated with the first integrated circuit synchronized using strobe signals received from the first integrated circuit (504). For example, controller 120 may communicate high-speed bidirectional data signals (e.g., CDQ[ ]) with interposer 110. Each data signal is deserialized into a plurality of deserialized data signals (506). For example, MUX/DEMUX circuitry 115*a* may deserialize each high-speed data signals CDQ[ ] from interface 112 into a respective plurality of lower-speed data signals CIDQ[ ] that are each operated at a lower data rate than CDQ[ ] is operated.

To serialization circuitry, each of the deserialized signals are communicated to serialization circuitry via parallel data couplings that are each operated at a lower data rate than the data signals (508). For example, MUX/DEMUX circuitry 115*a* and buffer circuitry 114*a*-114*b* may propagate CIDQ[ ] signals, which are each at a lower data rate than CDQ[ ], to MUX/DEMUX circuitry 115*b* (where they are received as MIDQ[ ] signals). Each of the deserialized data signals are serialized into respective reconstructions of the data signals (510). For example, MUX/DEMUX circuitry 115*b* may serialize the MIDQ[ ] signals to reconstruct the original high-speed CDQ[ ] signals as MDQ[ ] signals. The respective reconstructions of the data signals are communicated with a second integrated circuit (512). For example, the reconstructed high-speed data signals (MDQ) may be communicated with memory device 130 via interface 113 and interface 132.

Based on first information from the first integrated circuit, at leas one of the strobe signals is calibrated to produce correct deserializations of the data signals and correct reconstructions of the data signals (514). For example, during a calibration period, controller 120 may transmit a calibration pattern via CDQ[ ] (e.g., a toggling pattern). Memory device 130 may report back to controller 120 one or more error status indicators. Alternatively, memory device 130 may transmit the calibration pattern as received by memory device 130 back to controller 120, where controller 120 may then determine whether there were errors. Based on the error and/or loop-back information received by controller 120 from memory device 130, controller 120 may adjust the timing of one or more strobe signals transmitted by controller 120 (e.g., CWDQS[ ]), and/or cause (or command) interposer 110 to adjust the timing of one or more strobe signals (e.g., using control circuitry 111 to adjust the timing of CWDQS[ ] that is provided to MUX/DEMUX circuitry 115*a*).

The first power supply voltage is adjusted (516). For example, based on error and/or loop-back information received by controller 120 from memory device 130, controller 120 may adjust and/or cause (or command) interposer 110 to adjust the first power supply voltage (e.g., $V_{DD}$) that powers the circuits in $V_{DD}$ domain 140.

Figure 6:
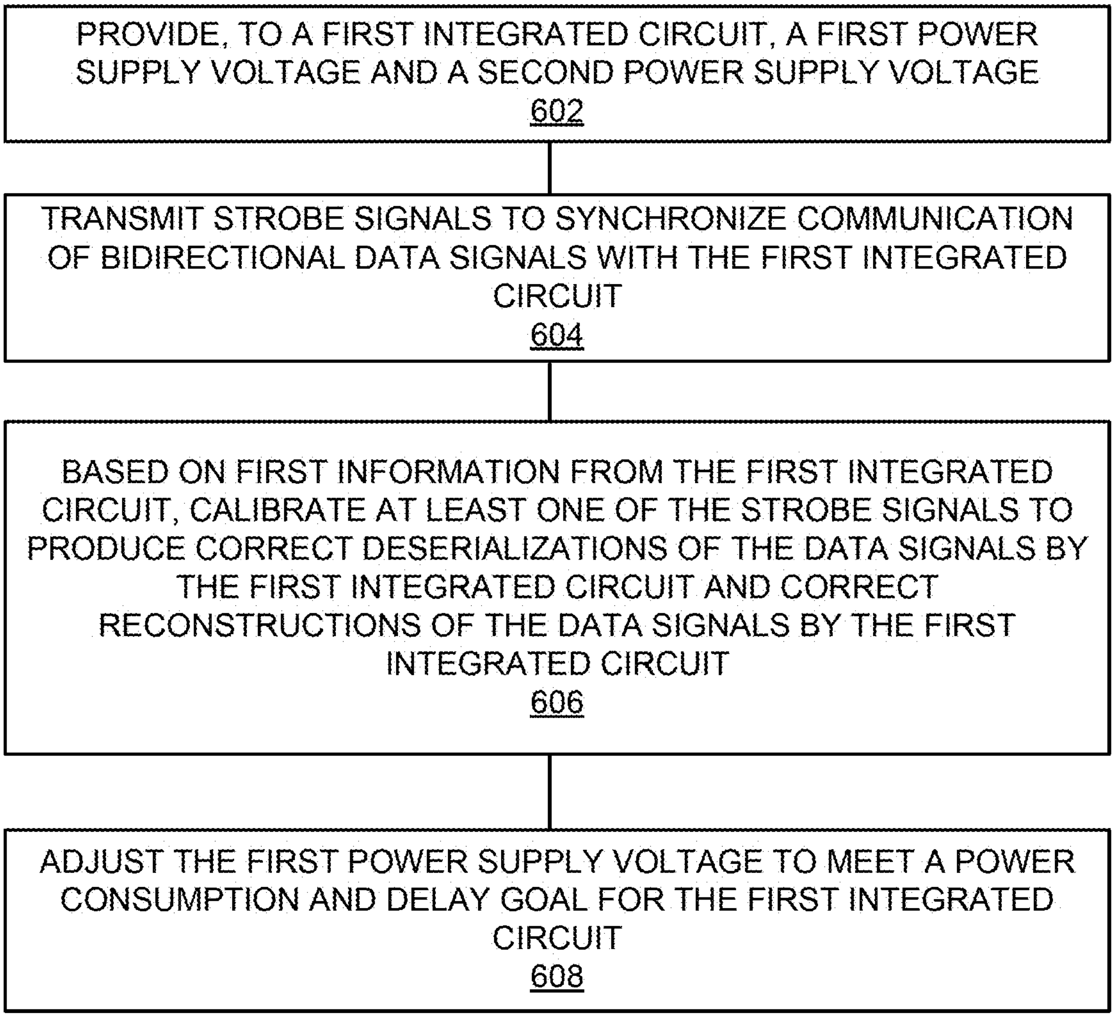
FIG. 6 is a flowchart illustrating a method of calibrating.

FIG. 6 is a flowchart illustrating a method of calibrating. One or more steps illustrated in FIG. 6 may be performed by, for example, system 100, MUX/DEMUX circuitry 200, and/or their components. To a first integrated circuit, a first power supply voltage and a second power supply voltage are provided (602). For example, controller 120 may provide, to interposer 110, a first power supply voltage (e.g., $V_{DD}$) to power the circuits in $V_{DD}$ domain 140, and a second power supply voltage (e.g., $V_{DDQ}$) to power the rest of the circuitry of interposer 110.

Strobe signals are transmitted to synchronize communication of bidirectional data signals with the first integrated circuit (604). For example, controller 120 may transmit strobe signals WDQS[ ] to synchronize communication, with interposer 110 via interface 122 and interface 112, of high-speed bidirectional data signals (e.g., CDQ[ ]). Based on first information from the first integrated circuit, calibrate at least one of the strobe signals to produce correct deserializations of the data signals by the first integrated circuit and correct reconstructions of the data signals by the first integrated circuit (606). For example, during a calibration period, controller 120 may transmit a calibration pattern via CDQ[ ] (e.g., a toggling pattern). Memory device 130 may report back to controller 120 one or more error status indicators. Alternatively, memory device 130 may transmit the calibration pattern as received by memory device 130 back to controller 120 via interposer 110, where controller 120 may then determine whether there were errors. Based on the error and/or loop-back information received by controller 120 from memory device 130 via interposer 110, controller 120 may adjust the timing of one or more strobe signals transmitted by controller 120 (e.g., CWDQS[ ]), and/or cause (or command) interposer 110 to adjust the timing of one or more strobe signals to adjust the timing of CWDQS[ ] that is provided to MUX/DEMUX circuitry 115*a* and adjust the timing of MWDQS[ ] provided to MUX/DEMUX circuitry 115*b*. In another example, based on the error and/or loop-back information received by controller 120 from memory device 130 via interposer 110, controller 120 may instruct memory device 130 to adjust the timing of one or more strobe signals transmitted by memory device 130 (e.g., MRDQS[ ]), and/or cause (or command) interposer 110 to adjust the timing of one or more strobe signals to adjust the timing of MRDQS[ ] that is provided to MUX/DEMUX circuitry 115*b* and adjust the timing of CRDQS[ ] provided to MUX/DEMUX circuitry 115*a*.

The first power supply voltage is adjusted to meet a power consumption and delay goal for the first integrated circuit (608). For example, controller 120 may adjust and/or cause (or command) interposer 110 to adjust the first power supply voltage (e.g., $V_{DD}$) that powers the circuits in $V_{DD}$ domain 140 in order to meet a power consumption by, and delay through, circuits in $V_{DD}$ domain 140. Optionally, step 606 and 608 are iterated to meet timing and power target.

Figure 7:
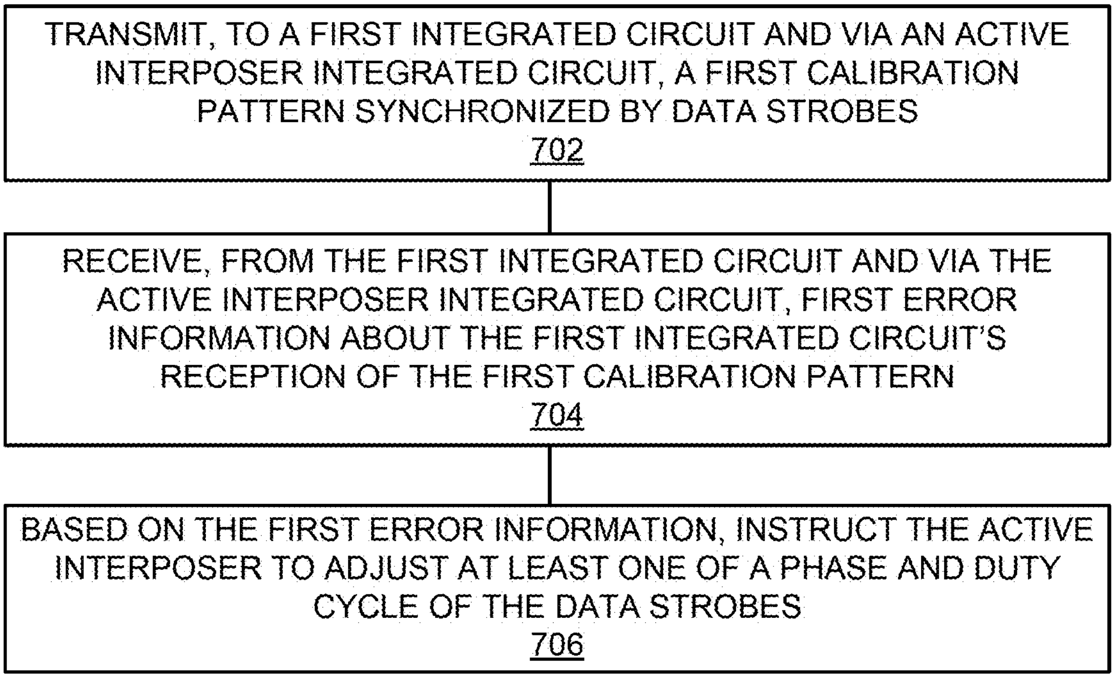
FIG. 7 is a flowchart illustrating a method of calibrating an active interposer.

FIG. 7 is a flowchart illustrating a method of calibrating an active interposer. One or more steps illustrated in FIG. 7 may be performed by, for example, system 100, MUX/DEMUX circuitry 200, and/or their components. To a first integrated circuit and via an active interposer integrated circuit, a first calibration pattern synchronized by data strobes is transmitted (702). For example, during a calibration period, controller 120 may transmit, to memory device 130 and via interposer 110, a calibration pattern that is synchronized by data strobes CWDQS[ ].

From the first integrated circuit and via the active interposer integrated circuit, first error information about the first integrated circuit's reception of the first calibration pattern is received (704). For example, memory device 130 may report, via interposer 110, one or more reception error status indicators to controller 120 Alternatively, memory device 130 may transmit the calibration pattern, as received by memory device 130, back to controller 120 and via interposer 110. Based on the first error information, the active interposer is instructed to adjust at least one of a phase and duty cycle of the data strobes (706). For example, based on the error and/or loop-back information received by controller 120 from memory device 130 via interposer 110, controller 120 may instruct (or command) interposer 110 to adjust the timing of CWDQS[ ] that is provided to MUX/DEMUX circuitry 115*a* (and MUX/DEMUX circuitry 115*b* as MWDQS[ ]) using control circuitry 111.

Figure 8:
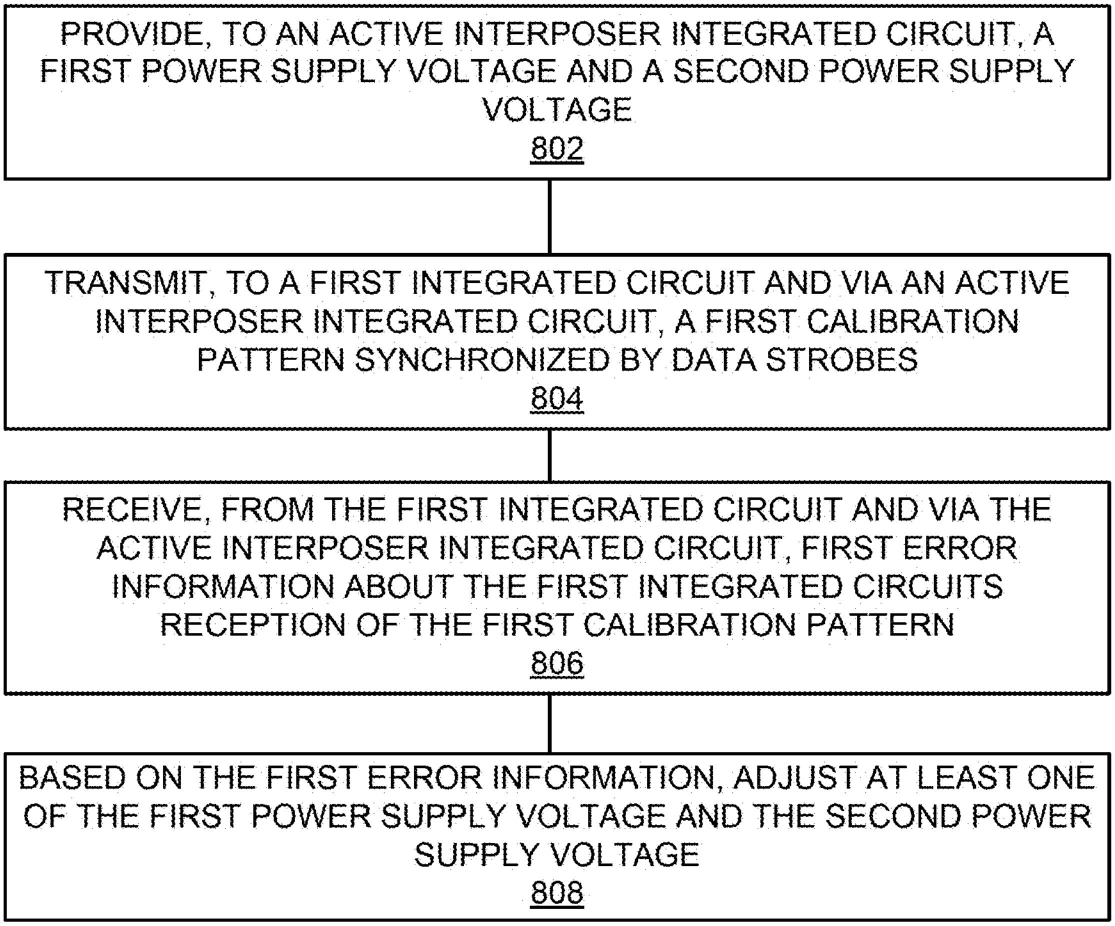
FIG. 8 is a flowchart illustrating a method of calibrating a power supply for an active interposer.

FIG. 8 is a flowchart illustrating a method of calibrating a power supply for an active interposer. One or more steps illustrated in FIG. 8 may be performed by, for example, system 100, MUX/DEMUX circuitry 200, and/or their components. To an active interposer integrated circuit, a first power supply voltage and a second power supply voltage are provided (802). For example, controller 120 may provide, to interposer 110, a first power supply voltage (e.g., $V_{DD}$) to power the circuits in $V_{DD}$ domain 140, and a second power supply voltage (e.g., $V_{DDQ}$) to power the rest of the circuitry of interposer 110.

To a first integrated circuit and via an active interposer integrated circuit, a first calibration pattern synchronized by data strobes is transmitted (804). For example, during a calibration period, controller 120 may transmit, to memory device 130 and via interposer 110, a calibration pattern that is synchronized by data strobes CWDQS[ ]. From the first integrated circuit and via the active interposer integrated circuit, first error information about the first integrated circuit's reception of the first calibration pattern is received (806). For example, memory device 130 may report, via interposer 110, one or more reception error status indicators to controller 120 Alternatively, memory device 130 may transmit the calibration pattern, as received by memory device 130, back to controller 120 and via interposer 110.

Based on the first error information, at least one of the first power supply voltage and the second power supply voltage are adjusted (808). For example, based on the error and/or loop-back information received by controller 120 from memory device 130 via interposer 110, controller 120 may adjust $V_{DD}$ and/or $V_{DDQ}$ to meet goals, thresholds, and or optimizations, for power consumed by, and/or delay through, interposer 110.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of system 100, MUX/DEMUX circuitry 200, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 9:
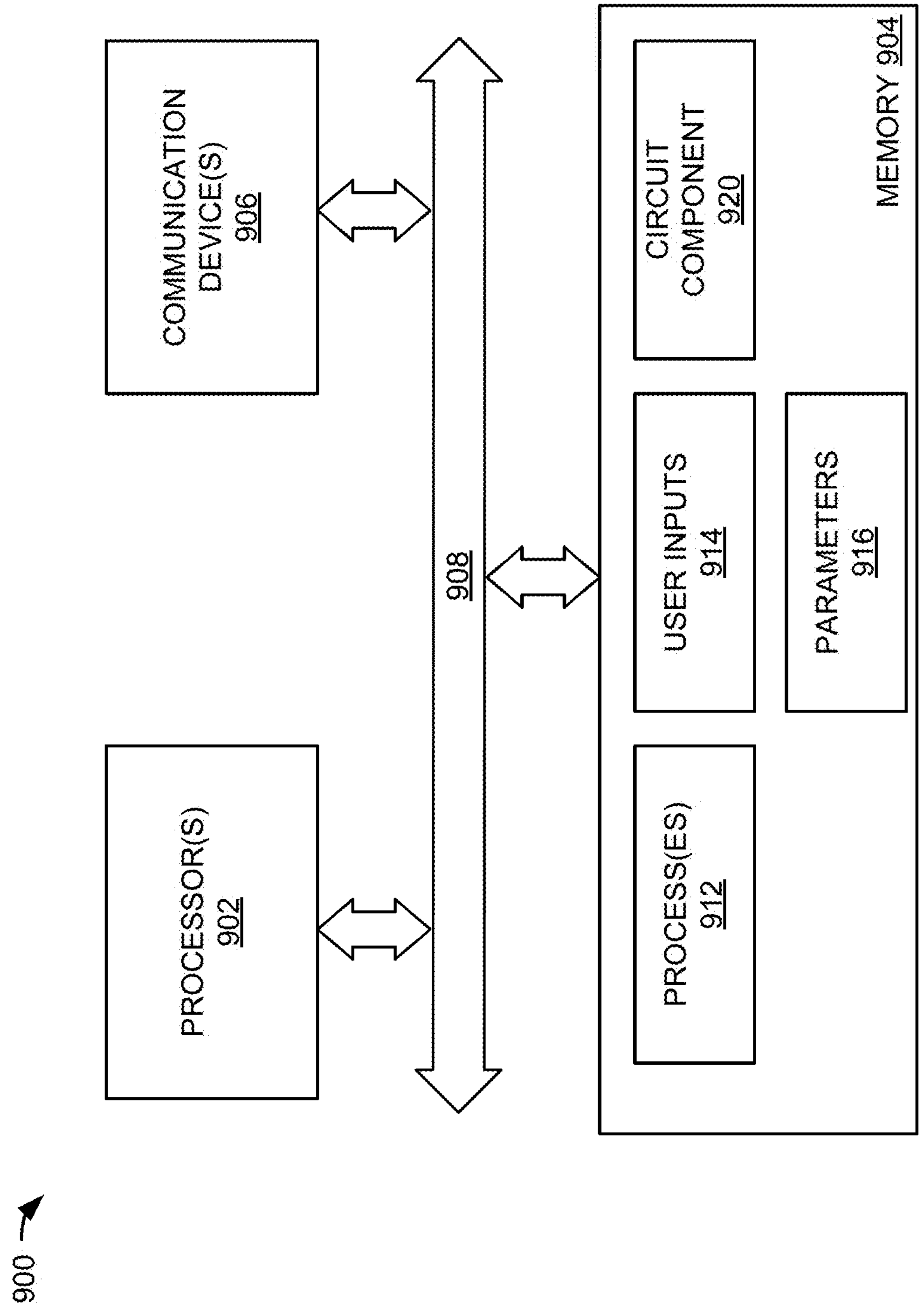
FIG. 9 is a block diagram of a processing system.

FIG. 9 is a block diagram illustrating one embodiment of a processing system 900 for including, processing, or generating, a representation of a circuit component 920. Processing system 900 includes one or more processors 902, a memory 904, and one or more communications devices 906. Processors 902, memory 904, and communications devices 906 communicate using any suitable type, number, and/or configuration of wired and/or wireless connections 908.

Processors 902 execute instructions of one or more processes 912 stored in a memory 904 to process and/or generate circuit component 920 responsive to user inputs 914 and parameters 916. Processes 912 may be any suitable electronic design automation (EDA) tool or portion thereof used to design, simulate, analyze, and/or verify electronic circuitry and/or generate photomasks for electronic circuitry. Representation 920 includes data that describes all or portions of system 100, MUX/DEMUX circuitry 200, and their components, as shown in the Figures.

Representation 920 may include one or more of behavioral, register transfer, logic component, transistor, and layout geometry-level descriptions. Moreover, representation 920 may be stored on storage media or communicated by carrier waves.

Data formats in which representation 920 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 914 may comprise input parameters from a keyboard, mouse, voice recognition interface, microphone and speakers, graphical display, touch screen, or other type of user interface device. This user interface may be distributed among multiple interface devices. Parameters 916 may include specifications and/or characteristics that are input to help define representation 920. For example, parameters 916 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 904 includes any suitable type, number, and/or configuration of non-transitory computer-readable storage media that stores processes 912, user inputs 914, parameters 916, and circuit component 920.

Communications devices 906 include any suitable type, number, and/or configuration of wired and/or wireless devices that transmit information from processing system 900 to another processing or storage system (not shown) and/or receive information from another processing or storage system (not shown). For example, communications devices 906 may transmit circuit component 920 to another system. Communications devices 906 may receive processes 912, user inputs 914, parameters 916, and/or circuit component 920 and cause processes 912, user inputs 914, parameters 916, and/or circuit component 920 to be stored in memory 904.

Implementations discussed herein include, but are not limited to, the following examples:

Example 1: An integrated circuit, comprising: a data interface to communicate a plurality of data signals with at least one integrated circuit via a data channel and synchronized using strobe signals, each respective data signal of the plurality of data signals to be deserialized, by the data channel, into a plurality of deserialized data signals communicated via parallel data interconnections that are each operated at a lower data rate than the respective data signal of the plurality of data signals, the plurality of deserialized data signals associated with each respective data signal of the plurality of data signals to be serialized, by the data channel, into a reconstruction of the respective data signal of the plurality of data signals and communicated to the at least one integrated circuit; strobe calibration circuitry to calibrate at least one of the strobe signals to produce correct deserializations, by the data channel, of the plurality of data signals, and to produce, by the data channel, correct reconstructions of the plurality of data signals; and circuitry to provide at least one supply voltage to be used by the data channel.

Example 2: The integrated circuit of example 1, wherein the data channel is to receive, from the integrated circuit, a first power supply voltage and a second power supply voltage.

Example 3: The integrated circuit of example 2, wherein the first power supply voltage is used by data channel circuitry that communicates deserialized versions of the plurality of data signals via the parallel data interconnections.

Example 4: The integrated circuit of example 3, further comprising: supply voltage calibration circuitry to adjust the first power supply voltage to tradeoff power consumption by the data channel and delay through the data channel.

Example 5: The integrated circuit of example 2, wherein the second power supply voltage is used by data channel circuitry that performs deserialization and data channel circuitry that performs serialization.

Example 6: The integrated circuit of example 2, wherein the first power supply voltage is used by data channel circuitry that communicates deserialized versions of the plurality of data signals via the parallel data interconnections, and wherein the second power supply voltage is used by data channel circuitry that performs deserialization and data channel circuitry that performs serialization.

Example 7: The integrated circuit of example 6, wherein the first power supply voltage and the second power supply voltage are independent of a third power supply voltage used by the data interface.

Example 8: The integrated circuit of example 1, wherein the integrated circuit is a controller and a first one the at least one integrated circuit is a memory device.

Example 9: An integrated circuit, comprising: a first data interface to communicate a plurality of bidirectional data signals with a first integrated circuit synchronized using strobe signals received from the first integrated circuit; deserialization circuitry to deserialize each respective data signal of the plurality of bidirectional data signals into a plurality of deserialized data signals to be communicated via parallel data interconnections of the integrated circuit that are each operated at a lower data rate than the respective data signal of the plurality of bidirectional data signals; serialization circuitry to serialize each of the plurality of deserialized data signals into a respective reconstruction of the respective data signal of the plurality of bidirectional data signals; a second data interface to communicate, with a second integrated circuit, respective reconstructions of the respective data signals of the plurality of bidirectional data signals; strobe calibration circuitry to, based on first information received from the first integrated circuit, calibrate at least one of the strobe signals to produce correct deserializations of the plurality of bidirectional data signals, and to produce correct reconstructions of the plurality of bidirectional data signals; and circuitry to receive, from the first integrated circuit, a first power supply voltage and a second power supply voltage.

Example 10: The integrated circuit of example 9, wherein the first power supply voltage is used by circuitry that communicates deserialized versions of the plurality of bidirectional data signals via the parallel data interconnections.

Example 11: The integrated circuit of example 10, further comprising: supply voltage calibration circuitry to adjust the first power supply voltage to tradeoff power consumption by the integrated circuit and delay through the integrated circuit.

Example 12: The integrated circuit of example 10, wherein the second power supply voltage is used by the deserialization circuitry and the serialization circuitry.

Example 13: The integrated circuit of example 12, wherein the first power supply voltage and the second power supply voltage are independent of a third power supply voltage used by the first data interface and the second data interface.

Example 14: The integrated circuit of example 9, wherein the first integrated circuit is a controller and the second integrated circuit is a memory device.

Example 15: An integrated circuit, comprising: a data interface to communicate a plurality of bidirectional data signals with another integrated circuit via a data channel integrated circuit, the communication of the plurality of bidirectional data signals via the data interface to by synchronized by strobe signals, the data channel integrated circuit to deserialize, using deserialization circuitry, each respective data signal of the plurality of bidirectional data signals into a plurality of deserialized data signals, the data channel integrated circuit to communicate, via parallel data interconnections that are each operated at a lower data rate than the respective data signal of the plurality of bidirectional data signals, the plurality of deserialized data signals to serialization circuitry, the serialization circuitry to reconstruct each of the respective data signals of the plurality of bidirectional data signals and communicate reconstructed versions of each of the respective data signals of the plurality of bidirectional data signals to the another integrated circuit; strobe calibration circuitry to calibrate at least one of the strobe signals to produce correct deserializations by the deserialization circuitry and to produce correct reconstructed versions of the plurality of bidirectional data signals by the serialization circuitry; and circuitry to provide at least one supply voltage to be used by data channel integrated circuit.

Example 16: The integrated circuit of example 15, wherein the data channel integrated circuit is to receive, from the integrated circuit, a first power supply voltage and a second power supply voltage.

Example 17: The integrated circuit of example 16, wherein the first power supply voltage is used by the data channel integrated circuit to power circuitry that communicates deserialized versions of the plurality of bidirectional data signals via the parallel data interconnections.

Example 18: The integrated circuit of example 17, further comprising:

supply voltage calibration circuitry to adjust the first power supply voltage to tradeoff power consumption by the data channel integrated circuit and delay through the data channel integrated circuit.

Example 19: The integrated circuit of example 16, wherein the second power supply voltage is used by the data channel integrated circuit to power the deserialization circuitry and the serialization circuitry.

Example 20: The integrated circuit of example 15, wherein the integrated circuit is a controller and the another integrated circuit is a memory device.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit, comprising:

a data interface to communicate a plurality of data signals with at least one integrated circuit via a data channel and synchronized using strobe signals, each respective data signal of the plurality of data signals to be deserialized, by the data channel, into a plurality of deserialized data signals communicated via parallel data interconnections that are each operated at a lower data rate than the respective data signal of the plurality of data signals, the plurality of deserialized data signals associated with each respective data signal of the plurality of data signals to be serialized, by the data channel, into a reconstruction of the respective data signal of the plurality of data signals from which the deserialized data signals were derived to be communicated with the at least one integrated circuit;

strobe calibration circuitry to calibrate at least one of the strobe signals to produce correct deserializations, by the data channel, of the plurality of data signals, and to produce, by the data channel, correct reconstructions of the plurality of data signals; and circuitry to provide at least one supply voltage to be used by the data channel.

2. The integrated circuit of claim 1, wherein the data channel is to receive, from the integrated circuit, a first power supply voltage and a second power supply voltage.

3. The integrated circuit of claim 2, wherein the first power supply voltage is used by data channel circuitry that communicates deserialized versions of the plurality of data signals via the parallel data interconnections.

4. The integrated circuit of claim 3, further comprising:

supply voltage calibration circuitry to adjust the first power supply voltage to tradeoff power consumption by the data channel and delay through the data channel.

5. The integrated circuit of claim 2, wherein the second power supply voltage is used by data channel circuitry that performs deserialization and data channel circuitry that performs serialization.

6. The integrated circuit of claim 2, wherein the first power supply voltage is used by data channel circuitry that communicates deserialized versions of the plurality of data signals via the parallel data interconnections, and wherein the second power supply voltage is used by data channel circuitry that performs deserialization and data channel circuitry that performs serialization.

7. The integrated circuit of claim 6, wherein the first power supply voltage and the second power supply voltage are independent of a third power supply voltage used by the data interface.

8. The integrated circuit of claim 1, wherein the integrated circuit is a controller and a first one of the at least one integrated circuit is a memory device.

9. An integrated circuit, comprising:

a first data interface to communicate a plurality of bidirectional data signals with a first integrated circuit synchronized using strobe signals received from the first integrated circuit;

deserialization circuitry to deserialize each respective data signal of the plurality of bidirectional data signals into a plurality of deserialized data signals to be communicated via parallel data interconnections of the integrated circuit that are each operated at a lower data rate than the respective data signal of the plurality of bidirectional data signals;

serialization circuitry to serialize each of the plurality of deserialized data signals into a respective reconstruction of the respective data signal of the plurality of bidirectional data signals;

a second data interface to communicate, with a second integrated circuit, respective reconstructions of the respective data signals of the plurality of bidirectional data signals;

strobe calibration circuitry to, based on first information received from the first integrated circuit, calibrate at least one of the strobe signals to produce correct deserializations of the plurality of bidirectional data signals, and to produce correct reconstructions of the plurality of bidirectional data signals; and circuitry to receive, from the first integrated circuit, a first power supply voltage and a second power supply voltage.

10. The integrated circuit of claim 9, wherein the first power supply voltage is used by circuitry that communicates deserialized versions of the plurality of bidirectional data signals via the parallel data interconnections.

11. The integrated circuit of claim 10, further comprising:

supply voltage calibration circuitry to adjust the first power supply voltage to tradeoff power consumption by the integrated circuit and delay through the integrated circuit.

12. The integrated circuit of claim 10, wherein the second power supply voltage is used by the deserialization circuitry and the serialization circuitry.

13. The integrated circuit of claim 12, wherein the first power supply voltage and the second power supply voltage are independent of a third power supply voltage used by the first data interface and the second data interface.

14. The integrated circuit of claim 9, wherein the first integrated circuit is a controller and the second integrated circuit is a memory device.

15. An integrated circuit, comprising:

a data interface to communicate a plurality of bidirectional data signals with another integrated circuit via a data channel integrated circuit, the communication of the plurality of bidirectional data signals via the data interface to be synchronized by strobe signals, the data channel integrated circuit to deserialize, using deserialization circuitry, each respective data signal of the plurality of bidirectional data signals into a plurality of deserialized data signals, the data channel integrated circuit to communicate, via parallel data interconnections that are each operated at a lower data rate than the respective data signal of the plurality of bidirectional data signals, the plurality of deserialized data signals to serialization circuitry, the serialization circuitry to serialize the plurality of deserialized data signals into a reconstruction of the bidirectional data signals from which the plurality of deserialized data signals were derived and communicate reconstructed versions of the bidirectional data signals with the another integrated circuit;

strobe calibration circuitry to calibrate at least one of the strobe signals to produce correct deserializations by the deserialization circuitry and to produce correct reconstructed versions of the plurality of bidirectional data signals by the serialization circuitry; and circuitry to provide at least one supply voltage to be used by data channel integrated circuit.

16. The integrated circuit of claim 15, wherein the data channel integrated circuit is to receive, from the integrated circuit, a first power supply voltage and a second power supply voltage.

17. The integrated circuit of claim 16, wherein the first power supply voltage is used by the data channel integrated circuit to power circuitry that communicates deserialized versions of the plurality of bidirectional data signals via the parallel data interconnections.

18. The integrated circuit of claim 17, further comprising:

supply voltage calibration circuitry to adjust the first power supply voltage to tradeoff power consumption by the data channel integrated circuit and delay through the data channel integrated circuit.

19. The integrated circuit of claim 16, wherein the second power supply voltage is used by the data channel integrated circuit to power the deserialization circuitry and the serialization circuitry.

20. The integrated circuit of claim 15, wherein the integrated circuit is a controller and the another integrated circuit is a memory device.

* * * * *